United States Patent
Benoist et al.

(10) Patent No.: US 8,937,334 B2
(45) Date of Patent: Jan. 20, 2015

(54) TRIGGERABLE BIDIRECTIONAL SEMICONDUCTOR DEVICE

(75) Inventors: Thomas Benoist, Grenoble (FR); Philippe Galy, Le Touvet (FR); Johan Bourgeat, Allevard (FR); Frank Jezequel, Sainte Rose (GP); Nicolas Guitard, Allevard (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 13/523,520

(22) Filed: Jun. 14, 2012

(65) Prior Publication Data
US 2012/0319204 A1    Dec. 20, 2012

(30) Foreign Application Priority Data
Jun. 15, 2011    (FR) ...................................... 11 55194

(51) Int. Cl.
*H01L 29/747*    (2006.01)
*H01L 27/02*    (2006.01)

(52) U.S. Cl.
CPC .......... *H01L 29/747* (2013.01); *H01L 27/0262* (2013.01)
USPC ...................................................... 257/119

(58) Field of Classification Search
CPC ................................................. H01L 27/0262
USPC ................................................. 257/355–363
See application file for complete search history.

(56) References Cited

U.S. PATENT DOCUMENTS

| | | | |
|---|---|---|---|
| 5,349,229 A * | 9/1994 | Wei et al. ....................... | 257/383 |
| 5,440,164 A * | 8/1995 | Finney et al. ................. | 257/378 |
| 6,864,537 B1 * | 3/2005 | Mallikarjunaswamy ..... | 257/355 |
| 7,560,777 B1 | 7/2009 | Salman et al. | |
| 2003/0075726 A1 * | 4/2003 | Ker et al. ...................... | 257/107 |
| 2003/0205761 A1 * | 11/2003 | Chang ........................... | 257/355 |
| 2006/0286753 A1 * | 12/2006 | Barthelmess et al. ........ | 438/282 |
| 2007/0052058 A1 * | 3/2007 | Hirler et al. ................... | 257/492 |
| 2007/0170512 A1 | 7/2007 | Gauthier et al. | |
| 2007/0262386 A1 * | 11/2007 | Gossner et al. ............... | 257/355 |
| 2010/0171149 A1 | 7/2010 | Denison et al. | |
| 2010/0270614 A1 * | 10/2010 | Croce et al. ................... | 257/337 |

OTHER PUBLICATIONS

"Thyristor Types," J. Webster ed., Wiley Encyclopedia of Electrical and Electronics Engineering, John Wiley & Sons, Inc., 1999, pp. 213-219.

* cited by examiner

*Primary Examiner* — Andy Huynh
*Assistant Examiner* — Sitaramarao S Yechuri
(74) *Attorney, Agent, or Firm* — Slater & Matsil, L.L.P.

(57) ABSTRACT

A triggerable bidirectional semiconductor device has two terminals and at least one gate. The device comprises, within a layer of silicon on insulator, a central semiconductor zone incorporating the at least one gate and comprising a central region having a first conductivity type, two intermediate regions having a second conductivity type respectively arranged on either side of and in contact with the central region, two semiconductor end zones respectively arranged on either side of the central zone, each end zone comprising two end regions having opposite types of conductivity, in contact with the adjacent intermediate region, the two end regions of each end zone being mutually connected electrically in order to form the two terminals of the device.

26 Claims, 6 Drawing Sheets

TRIGGERABLE BIDIRECTIONAL SEMICONDUCTOR DEVICE

This application claims priority to French National Patent Application No. 11/55194, which was filed Jun. 15, 2011 and which is incorporated herein by reference to the fullest extent allowable by law.

TECHNICAL FIELD

The invention relates to integrated circuits and in particular to triggerable bidirectional semiconductor devices, of the triac type, produced using CMOS technology within a silicon on insulator (SOI: Silicon On Insulator) substrate, in particular but not exclusively useable as an element for protection from electrostatic discharges (ESD: ElectroStatic Discharge).

BACKGROUND

In the field of microelectronics, an electrostatic discharge can occur throughout the lifetime of an integrated circuit and constitutes a real problem with regard to the reliability of that integrated circuit as well as a major cause of failure.

An electrostatic discharge generally results in a more or less large and more or less short current peak. An ESD protection device must therefore evacuate this current peak. Moreover, this current peak gives rise to a thermal constraint in the protection device.

A conventional ESD protection element comprises a triac. The production of such a protection element using a technology of the solid substrate type easily allows the dissipation of the heat generated by the ESD pulse through the contacts and the solid substrate in which the protection element is produced.

There are however other types of technologies and in particular the technologies using a substrate of the silicon on insulator type. Such a substrate comprises a layer of silicon placed on top of a buried oxide, commonly referred to by the acronym "BOX" (Buried OXide) by those skilled in the art. The components are then produced in this silicon layer.

In a partially depleted SOI (PDSOI: Partially Depleted SOI) technology with a technology node of 65 nm, the thickness of the buried oxide is of the order of 145 nm and that of the silicon layer on top of this buried oxide is of the order of 60 nm.

In a fully depleted SOI (FDSOI: Fully Depleted SOI) technology, the thickness of the buried oxide is variable as is that of the silicon layer. By way of indication, the thickness of the buried oxide can be of the order of 145 nm and that of the silicon layer on top of this buried oxide can be of the order of 7 nm. Thinner thicknesses are also possible, for example of the order of 10 or 20 nanometers for the buried oxide.

In an SOI technology, the presence of the buried oxide prevents the evacuation of heat in the downward direction that is to say through the silicon situated under the buried oxide, thus reducing the volume available for this thermal evacuation. Moreover, in the FDSOI technology, the very low volume available has a negative impact on the reliability of the triacs produced in the thin upper layer of silicon.

What is needed, then, is a device that overcomes at least some of the shortcomings of the prior art devices.

SUMMARY OF THE INVENTION

In accordance with one embodiment of the present invention, a triggerable bidirectional semiconductor device, having two terminals and at least one gate, is provided. The device includes, within a layer of silicon on insulator, a central semiconductor zone incorporating said at least one gate and including a central region having a first type of conductivity, and two intermediate regions having a second type of conductivity opposite to that of the first one respectively arranged on either side of and in contact with the central region. The device further includes two semiconductor end zones respectively arranged on either side of the central zone, each semiconductor end zone comprising two end regions having opposite types of conductivity, in contact with the adjacent intermediate region, the two end regions of each end zone being mutually connected electrically in order to form the two terminals of the device.

In another aspect, embodiments of the present invention provide for an integrated circuit comprising a substrate, the substrate including a base layer, an insulating layer formed on the base layer, and a semiconductor layer formed on the insulating layer. The integrated circuit further includes a component formed at least partially on the substrate, the component having a first terminal and a second terminal, and being subject to electrostatic discharge conditions. The integrated circuit further includes an electrostatic discharge protection device connected across the first terminal and the second terminal, and formed in the semiconductor layer. The discharge device includes a central region having a first type of conductivity type and having a first end and second end opposite the first end, a first intermediate region, having a second conductivity type opposite to the first conductivity type, forming a first junction with the first end of the central region; a second intermediate region, having the second conductivity type, forming a second junction with the second end of the central region, a first semiconductor end zone in contact with the first intermediate region and having a first end region of the first conductivity type and a second end region of the second conductivity type, the first and second end region being electrically connected to the first terminal, and a second semiconductor end zone in contact with the second intermediate region and having a third end region of the first conductivity type and a fourth end region of the second conductivity type, the third and fourth end regions being electrically connected to the second terminal.

In yet another aspect, embodiments of the present invention provide for an electrostatic discharge protection device comprising a substrate, an insulating layer formed on the substrate, and a semiconductor layer formed on the insulating layer. The semiconductor layer has formed therein a first end zone, the first end zone having a first end region of a first conductivity type and a second end region of a second conductivity type opposite the first conductivity type, a first intermediate region having the first conductivity type, the first intermediate region being adjacent to and forming a first junction with the first end region and the second end region, and a central region having the second conductivity type, the central region being adjacent to and forming a second junction with the first intermediate region. The semiconductor layer has further formed therein a second intermediate zone having the first conductivity type, the second intermediate region being adjacent to and forming a third junction with the central region, and a second end zone, the second end zone having a third end region of the first conductivity type and a fourth end region of the second conductivity type, the second end zone being adjacent to and forming a fourth junction with the second intermediate region. The device further includes a gate formed by at least one of the central region, and the first and second intermediate regions.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Before addressing the illustrated embodiments in detail various embodiments and advantages thereof will be discussed generally. For instance, according to one embodiment, there is proposed a triggerable bidirectional semiconductor device capable of operating in a reliable manner using SOI technology, whether partially or fully depleted, whilst improving the heat dissipation in the presence of an ESD pulse.

According to one aspect, there is proposed a triggerable bidirectional semiconductor device, having two terminals and at least one gate, and comprising within a layer of silicon on insulator, a central semiconductor zone incorporating the said at least one gate and comprising a central region having a first type of conductivity, for example N-type conductivity, two intermediate regions having a second type of conductivity opposite to that of the first one, for example P-type conductivity, respectively arranged on either side of and in contact with the central region, two semiconductor end zones respectively arranged on either side of the central zone, each end zone comprising two end regions having opposite types of conductivity, in contact with the adjacent intermediate region, the two end regions of each end zone being mutually connected electrically in order to form the two terminals of the device.

Throughout this description, the various embodiments will be described with regard to a silicon layer, a silicon on insulator layer, and the like. Those skilled in the art will recognize, however, that Germanium, Gallium, Arsenide, and other materials could be substituted in lieu of silicon. The scope of the present disclosure is intended to cover any semiconductor material and is not limited to silicon.

Thus, according to this aspect, the device comprises within the same structure two thyristors mutually connected in anti-parallel with a common central zone. When a first thyristor triggers under the effect of an ESD pulse having a certain polarity, the second thyristor is cut off but the different semiconductor regions which form it contribute to the dissipation of the thermal energy generated in the conducting thyristor. In other words, this second thyristor serves as a radiator for dissipating this thermal energy.

Moreover, when in the presence of an ESD pulse having the opposite polarity, it is the second thyristor which triggers and the first one which serves as a radiator.

The device can comprise one or more gates, for example a single gate formed by the said central region, or two gates formed by the two intermediate regions, or three gates respectively formed by the three regions of the central zone.

In order particularly to further favor heat dissipation whilst simplifying the masking stages making it possible to avoid siliconizings of PN junctions of the device during its manufacture, the device can furthermore comprise an additional semiconductor region, for example made of polysilicon, arranged over the central region and separated from this central region by a dielectric or grid oxide layer, or even two additional semiconductor regions respectively arranged over the two intermediate regions, each intermediate region being separated from the corresponding intermediate region by a dielectric or grid oxide layer.

The device can form a device for protection from electrostatic discharges, even though the device is not limited to that particular application. According to another aspect, there is proposed an integrated circuit comprising a device such as defined above.

Other features and advantages of the invention, in particular making it possible to improve the stability of the output signal whilst increasing the gain of the amplifier, will appear on examination of the following detailed description of illustrative embodiments that are in no way limiting and of the appended drawings.

Figure 1:
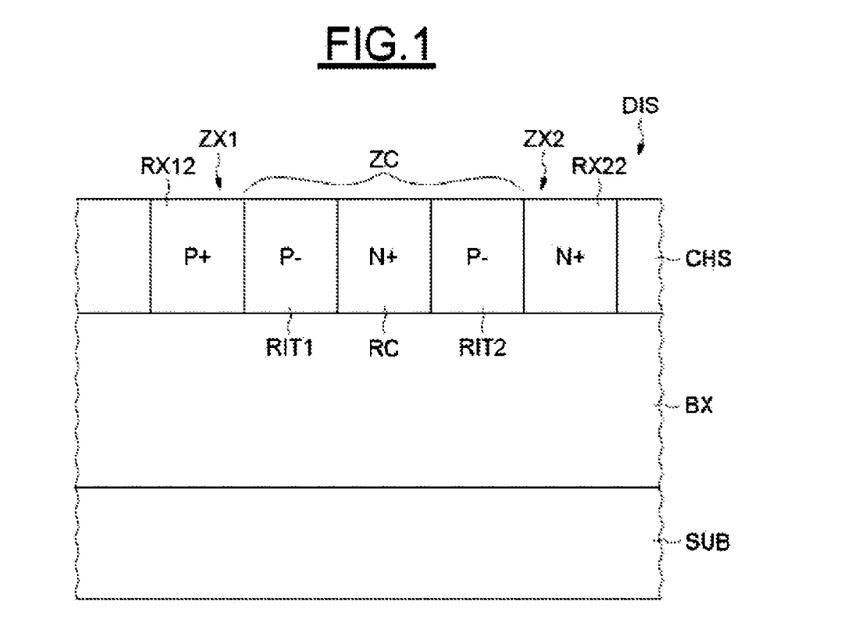
FIG. 1 schematically illustrates in cross-section view an illustrative embodiment.

Turning now to the illustrated embodiments. In FIG. 1, which is a partial cross section through the line I-I of FIG. 2, the device DIS is produced using a silicon on insulator (SOI: Silicon On Insulator) technology. More precisely, an upper layer of silicon CHS is separated from a lower silicon substrate SUB by a buried oxide layer BX.

The upper layer CHS can be partially depleted or fully depleted. In the example described in FIGS. 1 and 2, the layer CHS is fully depleted. The different semiconductor regions of the device DIS are produced in the upper layer CHS.

Figure 2:
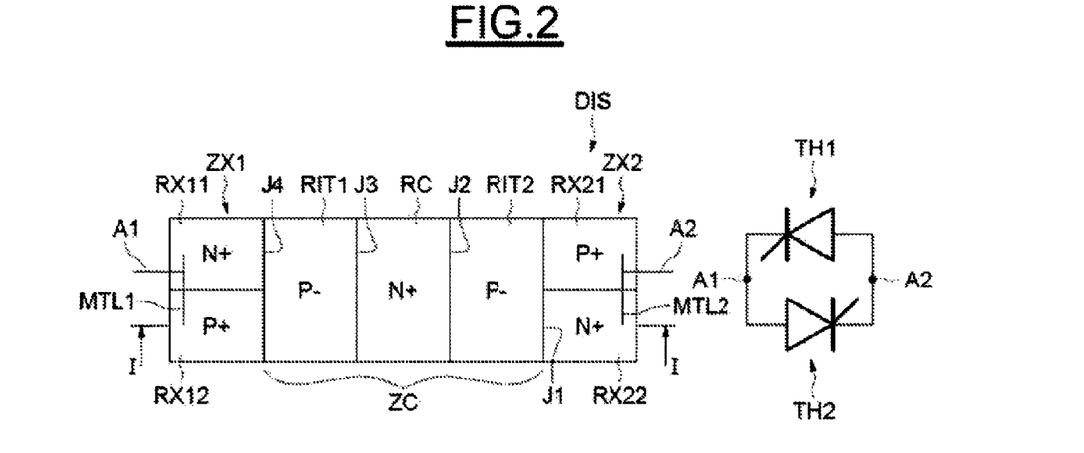
FIGS. 2-4 schematically illustrate in top-down view an illustrative embodiment.

More precisely, the device comprises a semiconductor central zone ZC, comprising a central region RC having a first type of conductivity, in this case N-type conductivity, and two intermediate regions RIT1, RIT2 having a second type of conductivity opposite to that of the first type, in this case P-type conductivity, these two intermediate regions RIT1, RIT2 being respectively arranged on either side of the central region RC whilst being in contact with this central region in order to form two PN junctions, referenced J2 and J3 in FIG. 2.

In an FDSOI technology, the intermediate regions RIT1, RIT2 are P– doped regions, typically having the same doping as that of the layer CHS and the central region RC is an N+ doped region. In a PDSOI technology, the intermediate regions RIT1, RIT2 are P blocks and the central region RC is an N block.

The device also comprises, on either side of the central zone ZC, two end zones ZX1, ZX2. Each end zone comprises two end regions having opposite types of conductivity, in contact with the adjacent intermediate region (as best illustrated in FIG. 2).

More precisely, in the embodiment described here, the first end zone ZX1 comprises a first end region RX11 having N-type conductivity and for example N+ doped whatever the type of SOI technology may be (FDSOI or PDSOI).

The first end zone ZX1 comprises a second end region RX12 having P-type conductivity and for example P+ doped whatever the type of SOI technology may be (FDSOI or PDSOI).

The first end region RX11 is in contact with the first intermediate region RIT1 of opposite type of conductivity in order to form a PN junction, referenced J4 in FIG. 2. The second end region RX12 is in contact with the first intermediate region RIT1 of the same type of conductivity in order to form a single semiconductor region of uniform type of conductivity, namely in this case P-type. The two end regions RX11 and RX12, are moreover in this case joined and mutually electrically connected together, for example by a surface metal silicide, in order to form a first terminal A1 of the device.

The second end zone ZX2 comprises a first end region RX21 having P-type conductivity and for example P+ doped whatever the type of SOI technology may be (FDSOI or PDSOI). The second end zone ZX2 further comprises a second end region RX22 having N-type conductivity and for example N+ doped whatever the type of SOI technology may be (FDSOI or PDSOI).

The second end region RX22 is in contact with the second intermediate region RIT2 of opposite type of conductivity in order to form a PN junction referenced J1 in FIG. 2. The first end region RX21 is in contact with the second intermediate region RIT2 of the same type of conductivity in order to form a single semiconductor region of uniform conductivity type, namely P-type in this case. The two end regions RX21 and RX22, are moreover in this case mutually joined and electrically connected together, for example by a surface metal silicide, in order to form a second terminal A2 of the device.

Moreover, in the example described here, the end region of a first end zone having the first type of conductivity, for example the region RX11 having N-type conductivity, is arranged opposite the end region RX21 of the second end zone ZX2 having P-type conductivity.

Similarly, the other end region RX12 of the first end zone ZX1, which has the first type of conductivity, for example P-type, is arranged opposite the end region RX22 of the second end zone ZX2 having N-type conductivity.

These different semiconductor regions thus form, as illustrated on the right hand side of FIG. 2, two thyristors TH1 and TH2, connected in antiparallel (head-to-tail).

More precisely, in the described example, the first thyristor TH1 comprises the region of uniform P-type conductivity formed by the region RX21 and by the upper part (in FIG. 2) of the intermediate region RIT2, the upper part (in FIG. 2) of the central region RC, the upper part (in FIG. 2) of the intermediate region RIT1, and the end region RX11. The second thyristor TH2 comprises the region of uniform P type conductivity formed by the region RX12 and by the lower part (in FIG. 2) of the intermediate region RIT1, the lower part (in FIG. 2) of the central region RC, the lower part (in FIG. 2) of the intermediate region RIT2, and the end region RX22.

Thus, when one of the thyristors is conducting after its triggering, for example in the presence of an ESD pulse, the other one is cut off but the corresponding semiconductor regions contribute to the dissipation of the thermal energy released in the conducting thyristor. This is illustrated in FIGS. 3 and 4.

Figure 3:
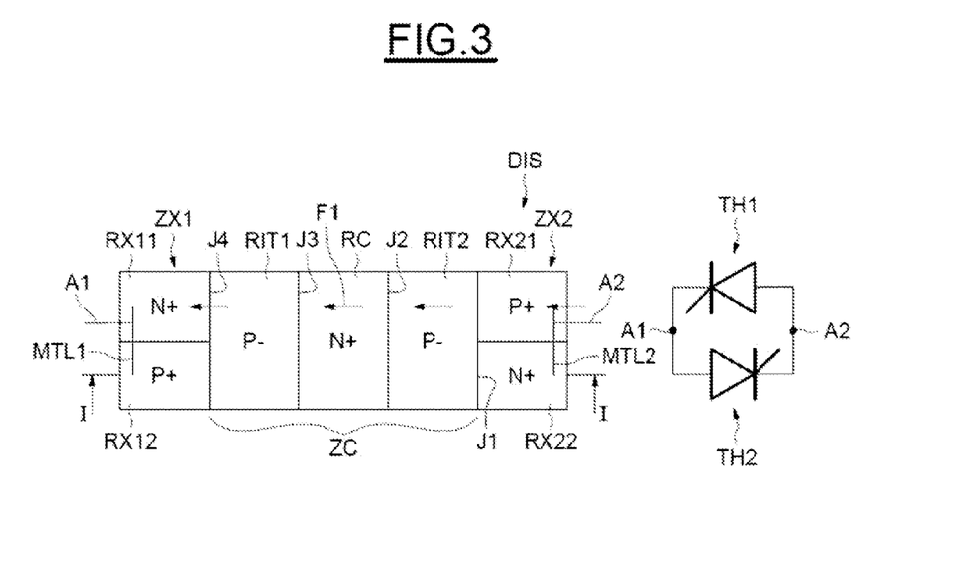
Figure 4:
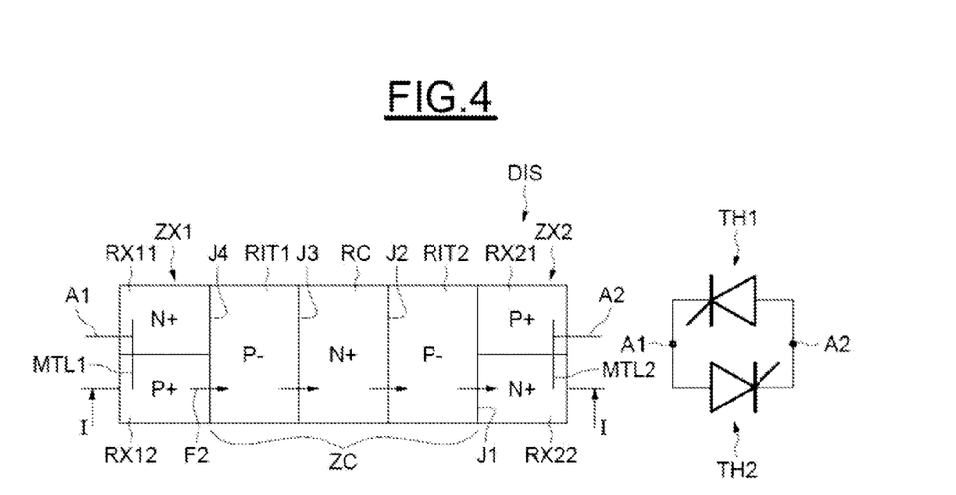

More precisely, in FIG. 3 the thyristor TH1 is conducting (arrows F1) and the thyristor TH2, cut-off, serves as a radiator. In FIG. 4, the thyristor TH2 is conducting (arrows F2) and the thyristor TH1, cut-off, serves as a radiator.

Figure 5:
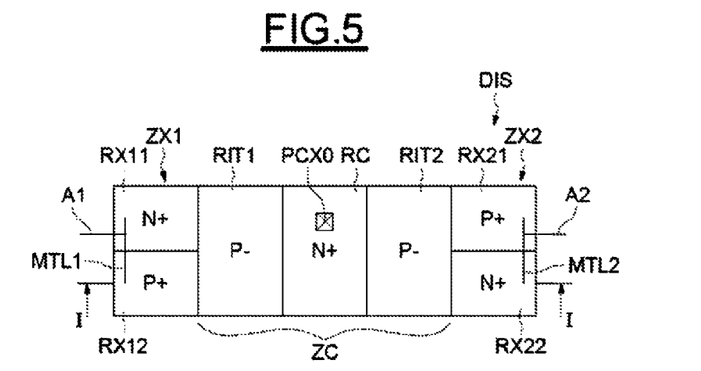
FIGS. 5-7 schematically illustrate in top-down view further illustrative embodiments.
Figure 6:
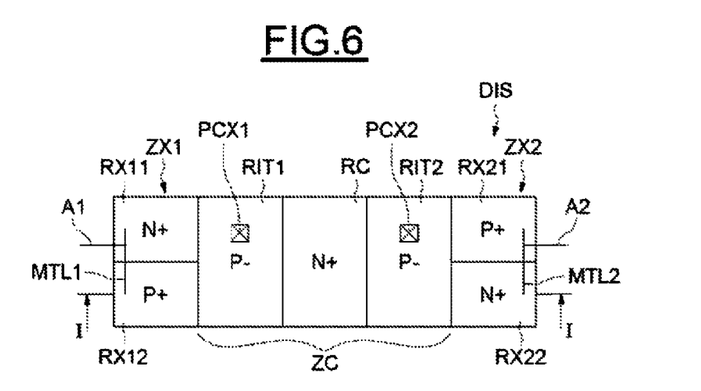
Figure 7:
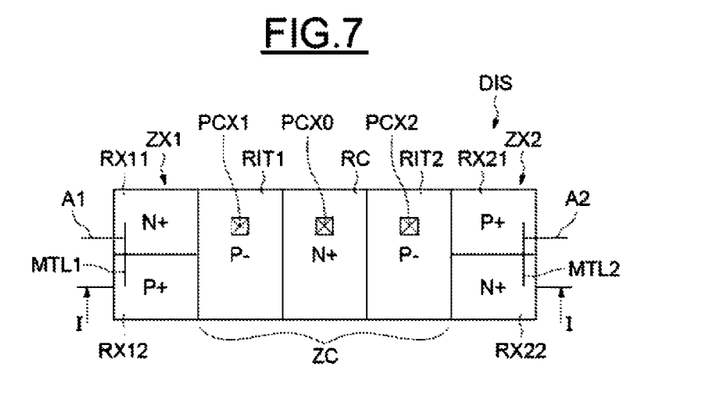

As shown in FIGS. 5 to 7, the device DIS can have one or more gates. More precisely, as shown in FIG. 5, the device can have a single gate formed by the central region RC. This gate makes it possible to trigger both thyristors, it being understood that in the presence of an ESD pulse only one of the thyristors will actually be conducting depending on the value of the polarity of the ESD pulse.

In this respect, an electrically conductive contact PCX0 is in this case directly in contact with the central region RC, in order to receive a triggering signal delivered by a conventional triggering circuit which is known per se, for example an NMOS transistor whose gate and substrate are connected to earth (GGNMOS: Grounded Gate NMOS), the drain of the transistor forming the output of the triggering circuit connected to the gate contact.

It is also possible, as shown in FIG. 6, for the device DIS to comprise two separate gates respectively formed by the two intermediate regions RIT1, RIT2. One of the gates is dedicated to one of the thyristors and the other gate is dedicated to the other thyristor. In this respect, two electrically conductive contacts PCX1, PCX2 are here shown directly in contact with the regions RIT1 and RIT2 respectively.

It is also possible, as shown in FIG. 7, for the device to comprise three gates, formed by the three semiconductor regions RC, RIT1 and RIT2 respectively of the central zone ZC. In this respect, three electrically conductive contacts PCX0, PCX1, PCX2 are in this case directly in contact with the regions RC, RIT1 and RIT2 respectively.

By way of indication, in a CMOS technology of the 65 nanometers PDSOI type, the device DIS triggers in the region of 1.3 volts and can absorb a current density of 12 milliamps/micrometer, whereas a conventional thyristor absorbs only 10.5 milliamps/micrometer.

In the embodiments that have just been described it has been seen that the end region of a first end zone having the first type of conductivity, for example the region RX11 having N-type conductivity, is arranged opposite the end region RX21 of the second end zone ZX2 having P-type conductivity.

Similarly, the other end region RX12 of the first end zone ZX1, which has the first type of conductivity, for example P-type conductivity, is arranged opposite the end region RX22 of the second end zone ZX2 having N-type conductivity.

This being so, it would be possible to reverse, for example, the regions RX11 and RX12, so that the region RX12 is opposite the region RX21 and the region RX11 is opposite the region RX22. In such a configuration, the thyristors would be formed along the two diagonals of the rectangle shown in FIG. 2. This being so, the configuration shown in FIGS. 1 to 7 remains preferable because it provides better uniformity of the device, in particular in terms of distance between the two terminals of the device.

Figure 8:
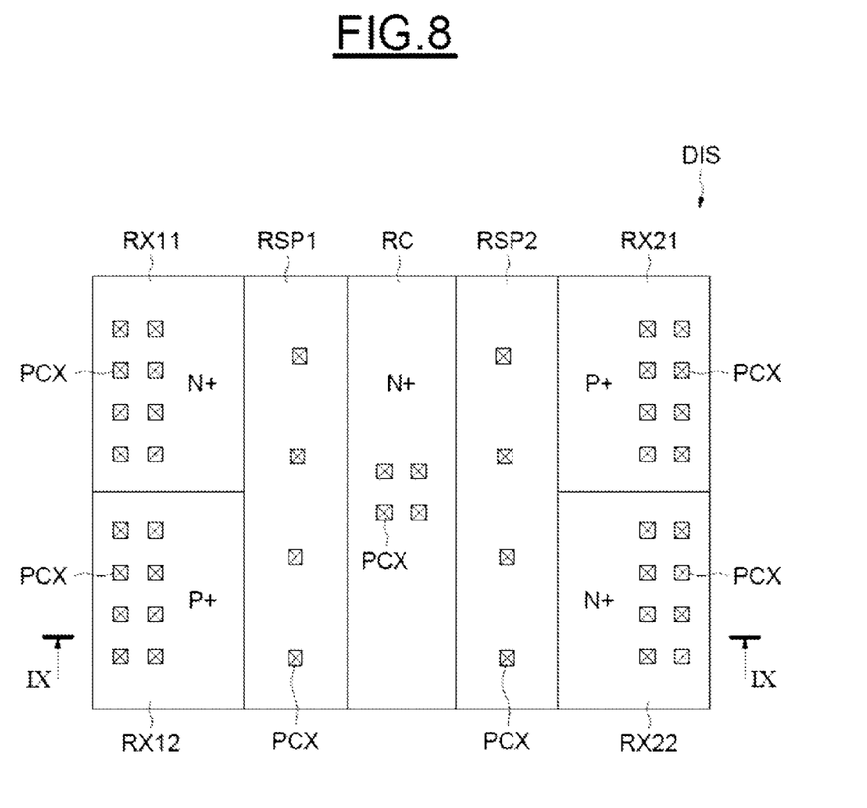
FIGS. 8 and 9 schematically illustrate in top-down view and cross-section view, respectively, yet another illustrative embodiment.
Figure 9:
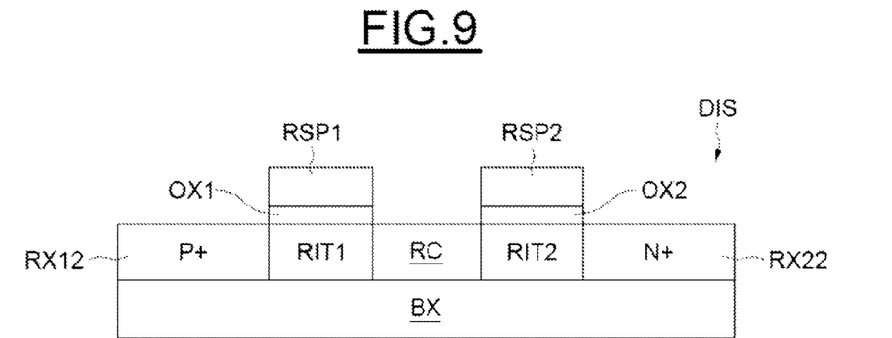

It is also possible, as shown in FIG. 8 and in FIG. 9, which is a partial cross section through the line IX-IX in FIG. 8, that the device also comprises two additional semiconductor regions RSP1, RSP2, for example polysilicon regions, arranged above the two intermediate regions RIT1 and RIT2 respectively and separated from these intermediate regions by two dielectric layers, for example grid oxides OX1, OX2. These additional regions thus form isolated grid regions above the regions RIT1 and RIT2. Such isolated grid regions have various advantages. In fact they participate in the heat dissipation.

Moreover, they protect the junctions J1-J4 and therefore make it possible to avoid, during the production of the device, the use of specific masks protecting these junctions from siliconizing which would result in short-circuiting them.

In the example shown in FIG. 8, electrically conductive contacts PCX are arranged directly in contact with the central region RC and other contacts PCX are arranged in direct contact with the isolated grid regions RSP1 and RSP2.

Thus, it is possible to trigger the device by the intermediary of its common gate formed in the region RC, but also by the intermediary of the contacts arranged on the isolated grid regions and which are, because of this, indirectly coupled to the subjacent intermediate regions RIT1 and RIT2. In this case, it can be considered that the device comprises three gates.

It would also be possible, as a variant, to furthermore provide electrically conductive contacts placed directly on the zones RIT1 and RIT2, which would make it possible to control the triggering of the thyristors at the level of the zones RIT1 and RIT2 by acting not only directly on these zones but also by the intermediary of the isolated grids which cover them.

The contacts PCX arranged on the end regions RX21 and RX22 are intended to be connected by metallizations in order to form the terminal A2 of the device, whereas the contacts PCX arranged on the regions RX11 and RX12 are also intended to be connected by one or more metallizations in order to form the other terminal A1 of the device.

Figure 10:
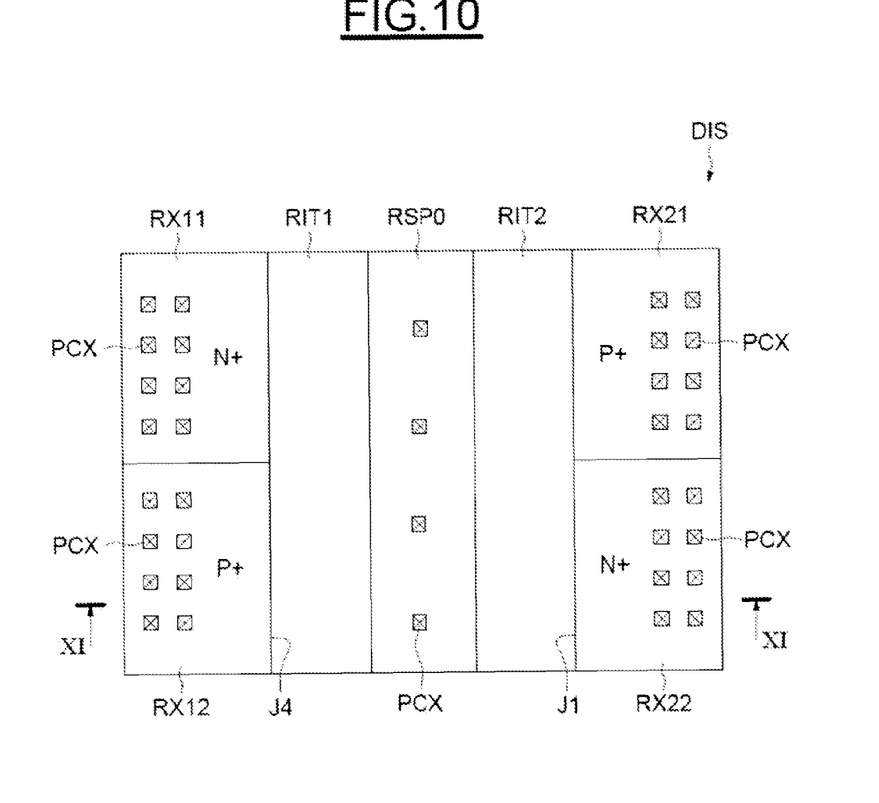
FIGS. 10 and 11 schematically illustrate in top-down view and cross-section view, respectively, still another illustrative embodiment.
Figure 11:
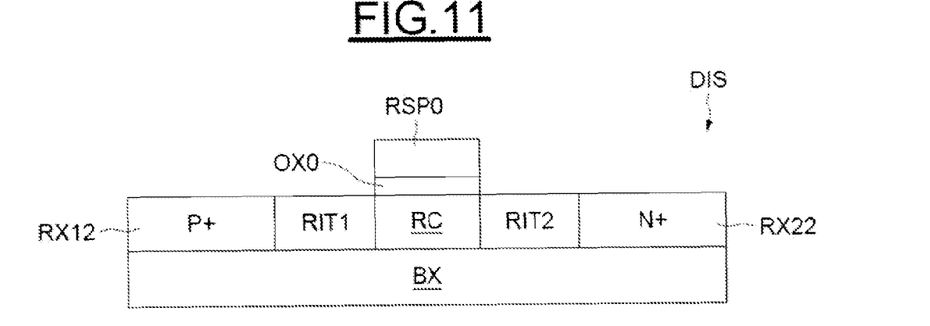

It is also possible, as shown in FIG. 10, and in FIG. 11 which is a partial cross section through the line XI-XI of FIG. 10, to place only one single isolated grid region RSP0 over the central region RC. The region RSP0 is separated from the region RC by the grid oxide OX0. In this case, it is still necessary to provide a specific mask in order to prevent the siliconizing of the junctions J1 and J4, but this mask can be smaller.

Here again, contacts PCX can be arranged directly on the isolated grid region RSP0 in order to be able to control the common gate of the device by the intermediary of these contacts which are, because of this, indirectly coupled with the central region RC.

The presence of these isolated grid regions makes it possible to limit the temperature peak within the semiconductor regions. Thus, for an FDSOI technology, the temperature peak can reach 400° K with the presence of isolated grids whereas it reaches 600° K in the absence of an isolated grid region.

Figure 12A:
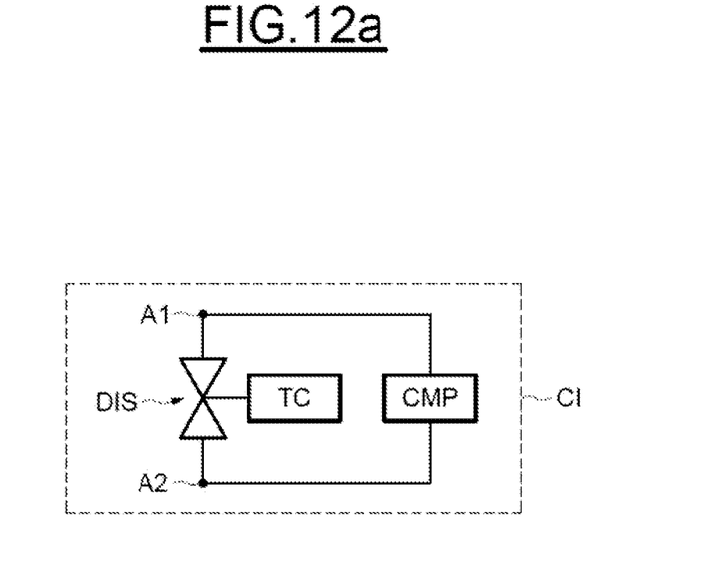
FIGS. 12a and 12b illustrate illustrative integrated circuit embodiments.

As shown in FIG. 12a, the device DIS can be used as ESD protection in order to protect a component CMP. The device DIS, controlled by the triggering circuit TC, is then connected to the two terminals of the component CMP.

Figure 12B:
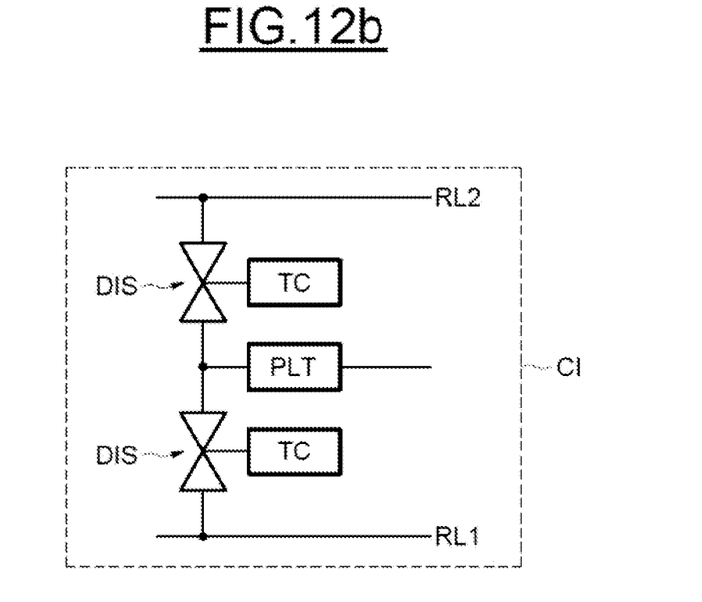

As shown in FIG. 12b, it is also possible to protect contacts, for example output contacts PLT of an integrated circuit CI, by connecting a device DIS between the contact PLT and a power supply rail RL2, and by connecting another device DIS between the contact PLT and an earth rail RL1.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A triggerable bidirectional semiconductor device, having two terminals and at least one gate, comprising:
a central semiconductor zone comprising fully depleted silicon on insulator and incorporating said at least one gate coupled to a layer of silicon on insulator, the central semiconductor zone including
a central region having a first type of conductivity,
two intermediate regions having a second type of conductivity opposite to that of the first one respectively arranged on either side of and in contact with the central region, wherein the entire and sole central region is more heavily doped than the two intermediate regions,
two semiconductor end zones respectively arranged on either side of the central zone, each semiconductor end zone comprising two end regions having opposite types of conductivity, in contact with the adjacent intermediate region, the two end regions of each end zone being mutually connected electrically in order to form the two terminals of the device, wherein each of the two end regions of each end zone is more heavily doped than the intermediate regions.

2. The device according to claim 1, wherein the at least one gate comprises a single gate formed by the said central region.

3. The device according to claim 1, wherein the at least one gate comprises two gates respectively formed by the two intermediate regions.

4. The device according to claim 1, wherein the at least one gate comprises three gates respectively formed by the central region and the two intermediate regions of the central semiconductor zone.

5. the device according to claim 1, wherein a first of the two end regions of a first semiconductor end zone having the first type of conductivity is arranged opposite a first of the two end regions of the second semiconductor end zone having the second type of conductivity, and a second of the two end regions of the first semiconductor end zone is arranged opposite a second of the two end regions of the second semiconductor end zone.

6. The device according to claim 1, wherein the at least one gate comprises at least one electrically conductive contact formed in at least one of the regions of the central zone.

7. The device according to claim 1, further comprising an additional semiconductor region arranged over the central region and separated from this central region by a dielectric layer.

8. The device according to claim 7, wherein at least one electrically conductive contact is coupled to the additional semiconductor region.

9. The device according to claim 1, further comprising two additional semiconductor regions respectively arranged over the two intermediate regions, each additional semiconductor region being separated from the corresponding intermediate region by a dielectric layer.

10. The device according to claim 1, wherein said intermediate regions in said silicon on insulator layer are fully depleted.

11. The device according to claim 1, wherein the at least one gate is directly coupled to at least one of the central region and either of the two intermediate regions.

12. An integrated circuit comprising:
a substrate, the substrate including a base layer, an insulating layer formed on the base layer, and a fully depleted semiconductor layer formed on the insulating layer;
a component formed at least partially on the substrate, the component having a first terminal and a second terminal, and being subject to electrostatic discharge conditions;

an electrostatic discharge protection device connected across the first terminal and the second terminal, and formed in the semiconductor layer, the electrostatic discharge device including:
- a central region having a first type of conductivity type and having a first end and second end opposite the first end,
- a first intermediate region, having a second conductivity type opposite to the first conductivity type, forming a first junction with the first end of the central region;
- a second intermediate region, having the second conductivity type, forming a second junction with the second end of the central region, wherein the entire and sole central region is more heavily doped than the first and second intermediate regions;
- a first electrically conductive contact directly coupled to the first intermediate region;
- a second electrically conductive contact directly coupled to the second intermediate region;
- a first semiconductor end zone in contact with the first intermediate region and having a first end region of the first conductivity type and a second end region of the second conductivity type, the first and second end region being electrically connected to the first terminal; and
- a second semiconductor end zone in contact with the second intermediate region and having a third end region of the first conductivity type and a fourth end region of the second conductivity type, the third and fourth end regions being electrically connected to the second terminal.

13. The integrated circuit of claim 12, further comprising a gate formed in the central region.

14. The integrated circuit of claim 12, wherein the semiconductor layer comprises silicon.

15. The integrated circuit of claim 12, wherein
the first semiconductor end zone, the first intermediate region, the central region, the second intermediate region, and the second end zone extend along a first direction;
the first and second end regions extend along a second direction substantially orthogonal to the first direction;
the third and fourth end regions extend along the second direction;
a line extending parallel to the first direction would intersect both the first end region and the third end region; and
a second line extending parallel to the first direction would intersect both the second end region and the fourth end region.

16. The integrated circuit of claim 12, wherein
the first semiconductor end zone, the first intermediate region, the central region, the second intermediate region, and the second end zone extend along a first direction;
the first and second end regions extend along a second direction substantially orthogonal to the first direction;
the third and fourth end regions extend along the second direction;
a line extending parallel to the first direction would intersect both the first end region and the fourth end region; and
a second line extending parallel to the first direction would intersect both the second end region and the third end region.

17. The integrated circuit of claim 12, further comprising a silicide region electrically connecting the first and second end region.

18. The integrated circuit of claim 12, wherein each of the first and second end regions of the first semiconductor end zone is more heavily doped than the first intermediate region, and wherein each of the first and second end regions of the second semiconductor end zone is more heavily doped than the second intermediate region.

19. An electrostatic discharge protection device comprising:
- a substrate;
- an insulating layer formed on the substrate;
- a fully depleted semiconductor layer formed on the insulating layer, the semiconductor layer having formed therein:
  - a first end zone, the first end zone having a first end region of a first conductivity type and a second end region of a second conductivity type opposite the first conductivity type,
  - a first intermediate region having the first conductivity type, the first intermediate region being adjacent to and forming a first junction with the first end region and the second end region;
  - a central region having the second conductivity type, the central region being adjacent to and forming a second junction with the first intermediate region;
  - a second intermediate region having the first conductivity type, the second intermediate region being adjacent to and forming a third junction with the central region, wherein the entire and sole central region is more heavily doped than the first and second intermediate regions; and
  - a second end zone, the second end zone having a third end region of the first conductivity type and a fourth end region of the second conductivity type, the second end zone being adjacent to and forming a fourth junction with the second intermediate region; and
- a gate formed by at least one of the central region, and the first and second intermediate regions.

20. The electrostatic discharge protection device of claim 19, further comprising a first terminal electrically connecting the first and second end regions and a second terminal electrically connecting the third and fourth end regions.

21. The electrostatic protection device of claim 19, wherein the semiconductor layer is a silicon layer and wherein the insulating layer is a buried oxide layer.

22. The electrostatic discharge protection device of claim 19, further comprising a second insulating layer formed over a portion of the semiconductor layer and an additional semiconductor region formed over the second insulating layer.

23. The electrostatic discharge protection device of claim 22, wherein the second insulating and the additional semiconductor region are formed over the central region.

24. The electrostatic discharge protection device of claim 22, wherein the second insulating and the additional semiconductor region are formed over the first and second intermediate regions.

25. The electrostatic discharge protection device of claim 19, wherein the gate is directly coupled to and in contact with at least one of the central region, and the first and second intermediate regions.

26. The electrostatic discharge protection device of claim 19, wherein the first and second end regions are more heavily doped than the first intermediate region, and wherein the third and fourth end regions are more heavily doped than the second intermediate region.

* * * * *